(12) United States Patent
Sasabayashi et al.

(10) Patent No.: US 9,343,234 B2
(45) Date of Patent: May 17, 2016

(54) MONOLITHIC CERAMIC ELECTRONIC COMPONENT

(71) Applicant: Murata Manufacturing Co., Ltd., Nagaokakyo-shi, Kyoto-fu (JP)

(72) Inventors: Takehisa Sasabayashi, Nagaokakyo (JP); Akihiro Motoki, Nagaokakyo (JP); Makoto Ogawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 231 days.

(21) Appl. No.: 14/228,331

(22) Filed: Mar. 28, 2014

(65) Prior Publication Data

US 2014/0293503 A1    Oct. 2, 2014

(30) Foreign Application Priority Data

Apr. 1, 2013   (JP) .................................. 2013-075734
Jan. 16, 2014  (JP) .................................. 2014-006228

(51) Int. Cl.

| | |
|---|---|
| *H01G 4/30* | (2006.01) |
| *H01C 1/148* | (2006.01) |
| *H01C 7/18* | (2006.01) |
| *H01F 17/00* | (2006.01) |
| *H01G 4/012* | (2006.01) |
| *H01G 4/232* | (2006.01) |
| *H01L 41/047* | (2006.01) |
| *H01F 27/29* | (2006.01) |
| *H01C 7/00* | (2006.01) |

(52) U.S. Cl.
CPC ................ *H01G 4/30* (2013.01); *H01C 1/148* (2013.01); *H01C 7/18* (2013.01); *H01F 17/0013* (2013.01); *H01F 27/292* (2013.01); *H01G 4/012* (2013.01); *H01G 4/232* (2013.01); *H01G 4/2325* (2013.01); *H01L 41/0471* (2013.01); *H01L 41/0472* (2013.01); *H01C 7/008* (2013.01)

(58) Field of Classification Search
None
See application file for complete search history.

(56) References Cited

U.S. PATENT DOCUMENTS

| | | |
|---|---|---|
| 3,296,012 A | 1/1967 | Stalnecker, Jr. |
| 5,880,925 A | 3/1999 | Dupre |
| 6,960,366 B2 | 11/2005 | Ritter et al. |

(Continued)

FOREIGN PATENT DOCUMENTS

| | | |
|---|---|---|
| JP | 63-169014 A | 7/1988 |
| JP | 2007-266457 A | 10/2007 |

(Continued)

OTHER PUBLICATIONS

Official Communication issued in corresponding Korean Patent Application No. 10-2014-0037468, mailed on Aug. 18, 2015.

*Primary Examiner* — Dion R Ferguson
(74) *Attorney, Agent, or Firm* — Keating & Bennett, LLP

(57) ABSTRACT

A monolithic ceramic electronic component includes an outer electrode including a first plating layer formed directly on a component body by electroless plating so as to cover an exposed portion distribution region including exposed portions of a plurality of inner electrodes and a second plating layer formed by electrolytic plating so as to cover the first plating layer. An amount of extension of the first plating E1 and an amount of extension of the second plating E2 satisfy the relationship $E1/(E1+E2) \leq 20\%$, where E1 represents a distance from an edge of the exposed portion distribution region to an edge of the first plating layer, and E2 represents a distance from the edge of the first plating layer to an edge of the second plating layer.

16 Claims, 12 Drawing Sheets

(56) References Cited

U.S. PATENT DOCUMENTS

| | | |
|---|---|---|
| 6,972,942 B2 | 12/2005 | Ritter et al. |
| 6,982,863 B2 | 1/2006 | Galvagni et al. |
| 7,067,172 B2 | 6/2006 | Ritter et al. |
| 7,152,291 B2 | 12/2006 | Ritter et al. |
| 7,154,374 B2 | 12/2006 | Ritter et al. |
| 7,161,794 B2 | 1/2007 | Galvagni et al. |
| 7,177,137 B2 | 2/2007 | Ritter et al. |
| 7,344,981 B2 | 3/2008 | Ritter et al. |
| 7,345,868 B2 | 3/2008 | Trinh |
| 7,463,474 B2 | 12/2008 | Ritter |
| 2005/0046536 A1 | 3/2005 | Ritter et al. |
| 2007/0014075 A1 | 1/2007 | Ritter et al. |
| 2008/0123248 A1 | 5/2008 | Kunishi et al. |
| 2008/0123249 A1 | 5/2008 | Kunishi et al. |
| 2008/0158774 A1 | 7/2008 | Trinh |
| 2009/0310278 A1* | 12/2009 | Tani ........................ H01G 4/005 361/306.3 |
| 2010/0128412 A1* | 5/2010 | Nishihara ................ H01G 4/30 361/306.3 |
| 2012/0039014 A1 | 2/2012 | Ogawa et al. |
| 2012/0039015 A1 | 2/2012 | Saruban et al. |
| 2012/0314338 A1* | 12/2012 | Togashi .................... H01G 4/30 361/306.3 |
| 2013/0229749 A1* | 9/2013 | Lee .......................... H01G 4/12 361/321.2 |

FOREIGN PATENT DOCUMENTS

| | | |
|---|---|---|
| JP | 2012-043841 A | 3/2012 |
| JP | 2012-253245 A | 12/2012 |
| KR | 10-2012-0022613 A | 3/2012 |

* cited by examiner

MONOLITHIC CERAMIC ELECTRONIC COMPONENT

BACKGROUND OF THE INVENTION

1. Field of the Invention

The present invention relates to a monolithic ceramic electronic component, in particular, to a monolithic ceramic electronic component in which an outer electrode that is connected to electrode layers such as inner electrodes located along ceramic layers includes a plating film and the plating film is directly connected the electrode layers.

2. Description of the Related Art

An outer electrode of a monolithic ceramic capacitor, which is an example of a monolithic ceramic electronic component, is usually formed by applying a conductive paste onto an end portion of a component body, and baking the conductive paste. However, an outer electrode formed by this method has a large thickness of several tens to several hundreds of micrometers. Accordingly, in order to control the dimensions of such a monolithic ceramic capacitor so as to be within certain specified values, it is necessary to undesirably reduce the effective volume for securing the electrostatic capacitance by an amount necessary to secure the volume of the outer electrode.

As a technique that can solve this problem, it has been proposed that a plating film be deposited directly on a component body so as to connect extending ends of a plurality of inner electrodes to each other and the plating film be used as at least a portion of an outer electrode. This technique has been put into practical use. For example, Japanese Unexamined Patent Application Publication No. 63-169014 discloses a method for forming an outer electrode, the method including depositing a conductive metal layer by electroless nickel (Ni) plating over the entire sidewall surface of a component body on which inner electrodes are exposed so that the inner electrodes exposed at the sidewall surface short-circuit each other. According to this method for forming an outer electrode, the volume of the outer electrode can be reduced, and consequently, the effective volume for securing the electrostatic capacitance can be increased.

However, the outer electrode formed by this method has the following problem. In the above-described case where an electrode is formed by baking a conductive paste, the conductive paste is fixed to a component body with glass or the like interposed therebetween. On the other hand, in the case where a plating film is formed directly on a particular surface of a component body by plating, the plating film is fixed to the component body without providing glass or the like therebetween. Therefore, the fixing force between the plating film and the component body is weak, and the plating film, that is, the outer electrode is easily separated from the component body.

SUMMARY OF THE INVENTION

Accordingly, preferred embodiments of the present invention provide a monolithic ceramic electronic component in which a force fixing an outer electrode to a component body, the outer electrode including a plating film that is directly connected to electrode layers such as inner electrodes, is significantly increased.

According to a preferred embodiment of the present invention, a monolithic ceramic electronic component includes a component body including a plurality of stacked ceramic layers and a plurality of electrode layers arranged along the ceramic layers, the electrode layers each including an exposed portion exposed at a particular surface, and an outer electrode arranged on the particular surface of the component body so as to be electrically connected to the exposed portions of the electrode layers.

The exposed portions of the electrode layers define an exposed portion distribution region on the particular surface.

The outer electrode includes a first plating layer that is formed directly on the particular surface by electroless plating so as to cover the exposed portion distribution region, and a second plating layer formed by electrolytic plating so as to cover the first plating layer.

The following relationship is satisfied:

$$\text{(amount of extension of first plating)}/\{\text{(amount of extension of first plating)}+\text{(amount of extension of second plating)}\} \leq 20\%$$

In the above formula, the amount of extension of first plating represents a distance from an edge of the exposed portion distribution region to an edge of the first plating layer, and the amount of extension of second plating represents a distance from the edge of the first plating layer to an edge of the second plating layer.

The relationship between the amount of extension of first plating and the amount of extension of second plating is determined by experimental examples described below. It was discovered and confirmed that when the above relationship of the amounts of plating extension is satisfied, the force with which the outer electrode is fixed to the component body is significantly increased.

The electrode layers preferably include an inner electrode arranged along an interface between the ceramic layers, and a surface electrode arranged along the ceramic layers and on an outer surface of the component body. With this structure, the area of the exposed portion distribution region is significantly increased. Consequently, the outer electrode is provided over a wider surface on the component body, and the force with which the outer electrode is fixed to the component body is further increased.

According to a preferred embodiment of the present invention, the first plating layer preferably includes a Ni—P plating layer, and a phosphorus content of the first plating layer is preferably about 9% by weight to about 13% by weight, for example. With this structure, the force with which the outer electrode is fixed is further increased. Furthermore, this structure also contributes to the improvement in thermal shock resistance and moisture-proof reliability.

According to a preferred embodiment of the present invention, the second plating layer preferably includes a plurality of plating films. With this structure, in the second plating layer, a plurality of different functions such as the improvement in solder wettability and the prevention of solder leaching can be respectively achieved by different plating films.

According to a preferred embodiment of the present invention, it is possible to increase the force with which an outer electrode is fixed to a component body, the outer electrode including a plating film that is directly connected to electrode layers.

According to a preferred embodiment of the present invention, the first plating layer functioning as an underlying layer of an outer electrode is formed by electroless plating. By electroless plating, it is possible for plating to be performed on a surface that is not electrically conductive. Therefore, it is also possible to perform plating on a portion of the exposed portion distribution region other than the exposed portion of an electrode layer.

On the other hand, the second plating layer formed so as to cover the first plating layer is formed by electrolytic plating.

In electrolytic plating, plating is grown faster than in electroless plating. Accordingly, a plating film formed by electrolytic plating strongly engages with irregularities on a ceramic surface compared with a plating film formed by electroless plating. Therefore, an electrolytic plating film achieves a larger anchoring effect on the ceramic surface, and consequently, a higher joining force is realized.

In a preferred embodiment of the present invention, the second plating layer formed by electrolytic plating directly contacts with a ceramic surface in a peripheral portion of the first plating layer, that is, in a peripheral edge portion of an outer electrode. Accordingly, the force with which the outer electrode is joined to a component body that provides a ceramic surface is further increased in the peripheral edge portion of the outer electrode. Considering the phenomenon that when separation of an outer electrode occurs, the outer electrode is often separated from a peripheral edge portion thereof, this structure is particularly effective to prevent the separation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described using monolithic ceramic capacitors as examples.

First Preferred Embodiment

Figure 3:
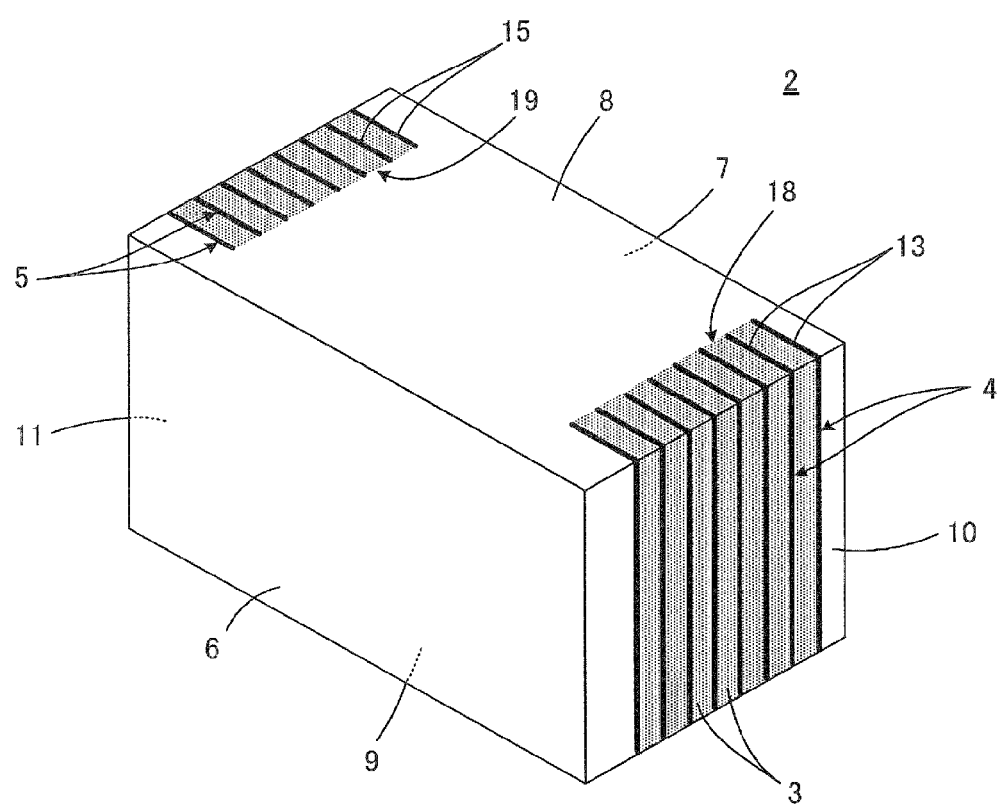
FIG. 3 is a perspective view showing an appearance of a component body included in the monolithic ceramic capacitor shown in FIG. 1.

FIGS. 1 to 5 are views illustrating a two-terminal-type monolithic ceramic capacitor 1 according to a first preferred embodiment of the present invention. The monolithic ceramic capacitor 1 includes a component body 2 whose appearance is shown in FIG. 3. The component body 2 includes a plurality of stacked ceramic layers 3, and first inner electrodes 4 and second inner electrodes 5 that serve as a plurality of electrode layers arranged along the ceramic layers 3. The inner electrodes 4 and 5 are disposed at interfaces between the ceramic layers 3. The ceramic layers 3 preferably are composed of, for example, a barium titanate-based dielectric ceramic. The inner electrodes 4 and 5 preferably contain, for example, Ni as a conductive component.

The component body 2 has a rectangular or substantially rectangular parallelepiped shape including a first main surface 6 and a second main surface 7 that extend in a direction in which the ceramic layers 3 extend, a first lateral surface 8, a second lateral surface 9, a first end surface 10, and a second end surface 11 that extend in a stacking direction of the ceramic layers 3. The monolithic ceramic capacitor 1 is usually designed to be mounted so that the inner electrodes 4 and 5 are directed in a direction perpendicular or substantially perpendicular to a mounting substrate (not shown). Accordingly, the first lateral surface 8 or the second lateral surface 9 is directed to the mounting substrate side.

As shown in FIG. 2A, the first inner electrode 4 includes an extending portion 13 and a capacitance-generating portion 12 that constitutes a main portion of the first inner electrode 4. The extending portion 13 is exposed at the first end surface 10, a portion of the first lateral surface 8, and a portion of the second lateral surface 9, the first lateral surface 8 and the second lateral surface 9 being adjacent to the first end surface 10, and constitutes an exposed portion in these areas. FIG. 3 also shows the configuration of the exposed portions.

As shown in FIG. 2B, the second inner electrode 5 includes an extending portion 15 and a capacitance-generating portion 14 that constitutes a main portion of the second inner electrode 5. The extending portion 15 is located on the opposite side of the extending portion 13 of the first inner electrode 4. The extending portion 15 is exposed at the second end surface 11, a portion of the first lateral surface 8, and a portion of the second lateral surface 9, the first lateral surface 8 and the second lateral surface 9 being adjacent to the second end surface 11, and constitutes an exposed portion in these areas. FIG. 3 also shows the configuration of the exposed portions.

The component body 2 described above is produced, for example, as follows.

A plurality of ceramic green sheets which are to become the ceramic layers 3 are prepared. Next, a conductive paste film which is to become the inner electrode 4 or 5 is formed on each of the ceramic green sheets by printing. Subsequently, the ceramic green sheets each having the conductive paste film thereon are stacked such that the first inner electrodes 4 and the second inner electrodes 5 are alternately arranged in the stacking direction. In addition, an appropriate number of ceramic green sheets on which a conductive paste film is not formed are stacked on both end portions of the stacking direction so as to form outer layer portions. Thus, a component body 2 in a raw state is prepared.

The above-described stacking step may be performed by using mother ceramic green sheets from which a plurality of component bodies 2 can be produced. After the stacking step, a cutting step may be performed to prepare the respective component bodies 2 in a raw state.

Subsequently, the component body in the raw state is fired. Consequently, the sintered component body 2 shown in FIG. 3 is prepared. The component body 2 includes a plurality of ceramic layers 3 formed by sintering the ceramic green sheets and inner electrodes 4 and 5 formed by sintering the conductive paste films.

Next, preferably, a barrel polishing step is performed for the component body 2. Through this step, the exposed portions of the inner electrodes 4 and 5 are more reliably exposed. Next, preferably, a washing step with pure water is performed.

Figure 1:
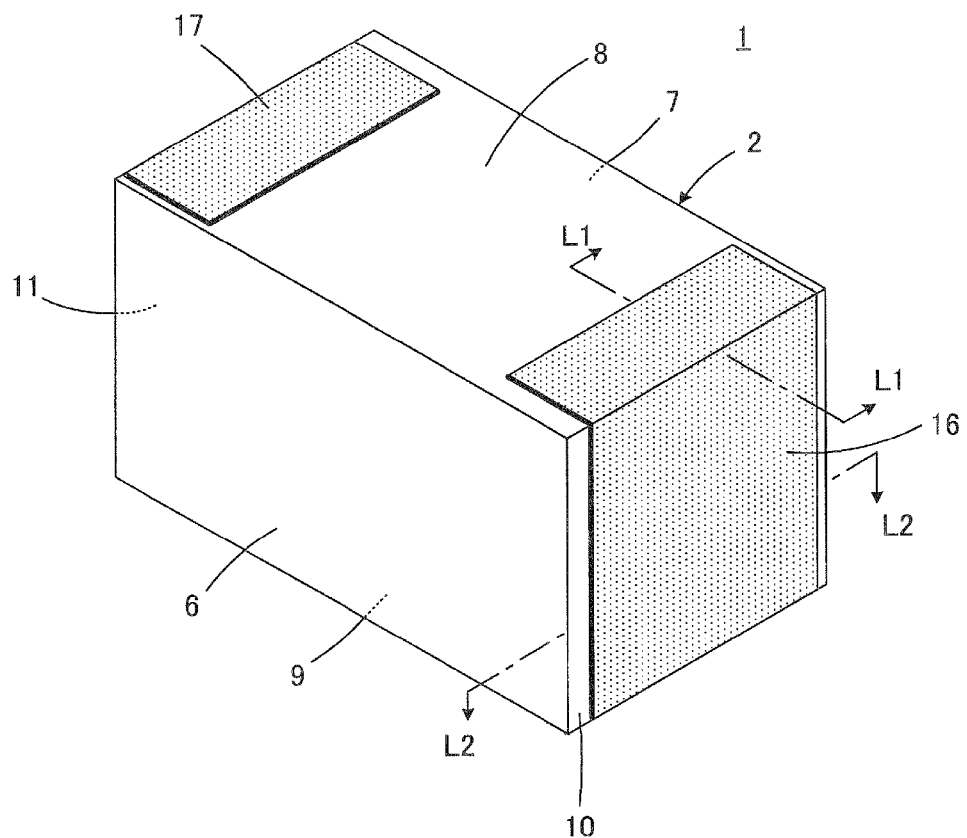
FIG. 1 is a perspective view showing an appearance of a monolithic ceramic capacitor which is a two-terminal-type monolithic ceramic electronic component according to a first preferred embodiment of the present invention.
Figure 2:
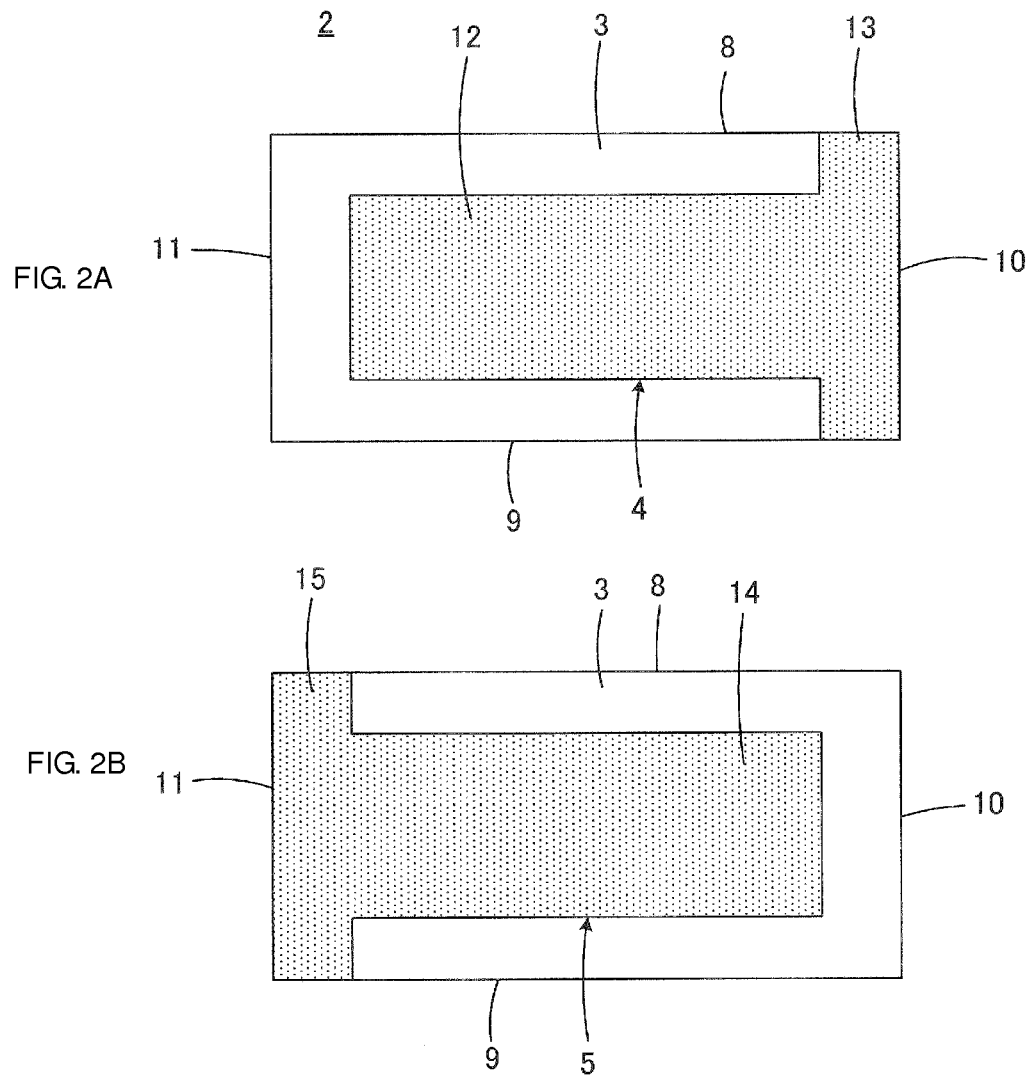
FIG. 2A is a plan view illustrating the structure of a component body included in the monolithic ceramic capacitor shown in FIG. 1 and shows a surface through which a first inner electrode passes.
FIG. 2B is a plan view illustrating the structure of a component body included in the monolithic ceramic capacitor shown in FIG. 1 and shows a surface through which a second inner electrode passes.

Next, in order to obtain the monolithic ceramic capacitor 1 shown in FIG. 1, a first outer electrode 16 that is electrically connected to the exposed portions of the first inner electrodes 4 and a second outer electrode 17 that is electrically connected to the exposed portions of the second inner electrodes 5 are formed. The structures of the first outer electrode 16 and the second outer electrode 17 and a method for forming the outer electrodes 16 and 17 will now be described.

As shown in FIG. 3, the exposed portions of the plurality of first inner electrodes 4 are aligned in the stacking direction of the ceramic layers 3 and define a first exposed portion distribution region 18. In FIG. 3, the first exposed portion distribution region 18 and a second exposed portion distribution region 19 described below are shown by a large number of dots so as to be distinguished from other regions. Specifically, the first exposed portion distribution region 18 is constituted by the exposed portions of the plurality of first inner electrodes 4 and exposed portions of the plurality of ceramic layers 3 interposed between the exposed portions of the first inner electrodes 4. The first exposed portion distribution region 18 extends to the first end surface 10, a portion of the first lateral surface 8, and a portion of the second lateral surface 9, the first lateral surface 8 and the second lateral surface 9 being adjacent to the first end surface 10.

The exposed portions of the plurality of second inner electrodes 5 are aligned in the stacking direction of the ceramic layers 3 and define a second exposed portion distribution region 19. The second exposed portion distribution region 19 extends to the second end surface 11, a portion of the first lateral surface 8, and a portion of the second lateral surface 9, the first lateral surface 8 and the second lateral surface 9 being adjacent to the second end surface 11.

In FIG. 3, the exposed portions of the first inner electrodes 4 and the exposed portions of the second inner electrodes 5 are respectively shown in the first exposed portion distribution region 18 and the second exposed portion distribution region 19. For the sake of convenience of the illustration, the distribution density of the exposed portions shown in the figure is lower than that of the actual component body. This also applies to FIGS. 8 and 12 described below.

The first outer electrode 16 and the second outer electrode 17 preferably are formed at the same time and preferably have the same cross-sectional structure, for example. Therefore, the first outer electrode 16 shown in FIGS. 4 and 5 will be described in more detail, and a detailed description of the second outer electrode 17 is omitted.

Figure 4:
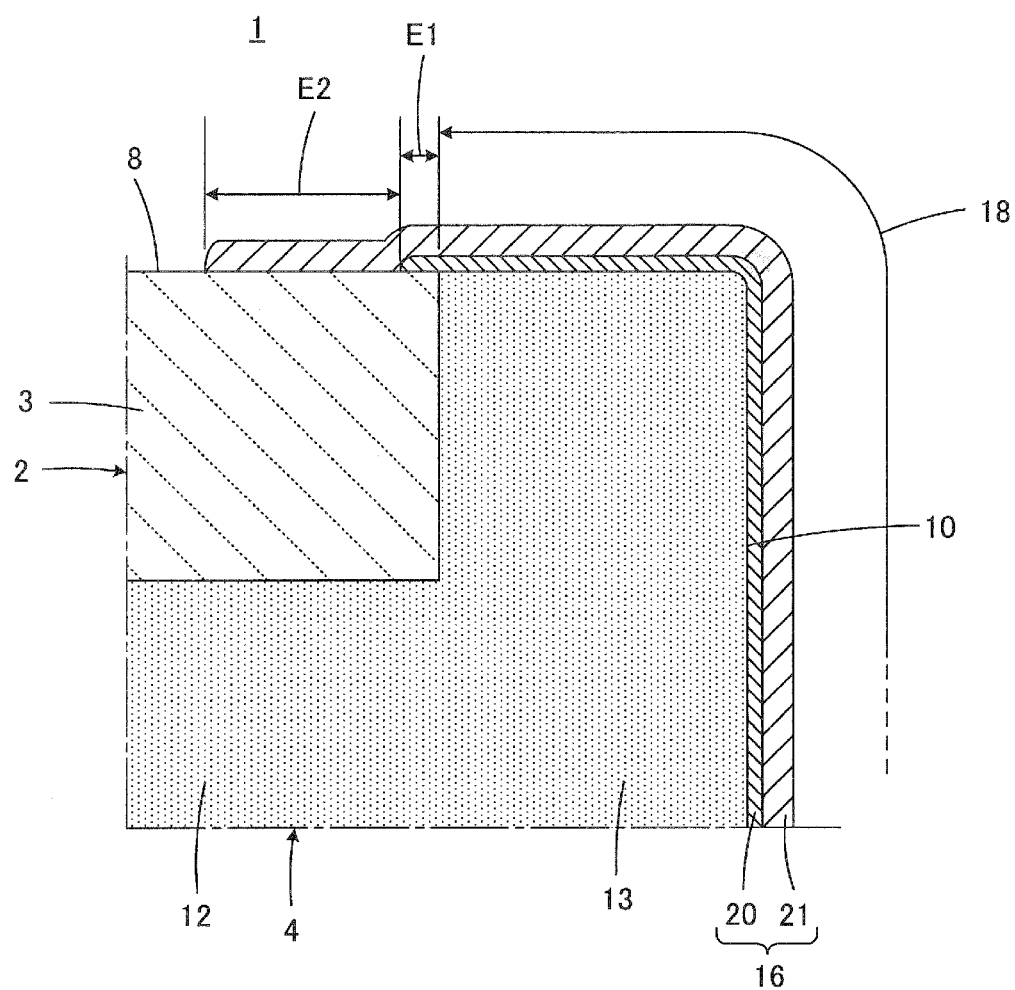
FIG. 4 is an enlarged cross-sectional view taken along line L1-L1 in FIG. 1.
Figure 5:
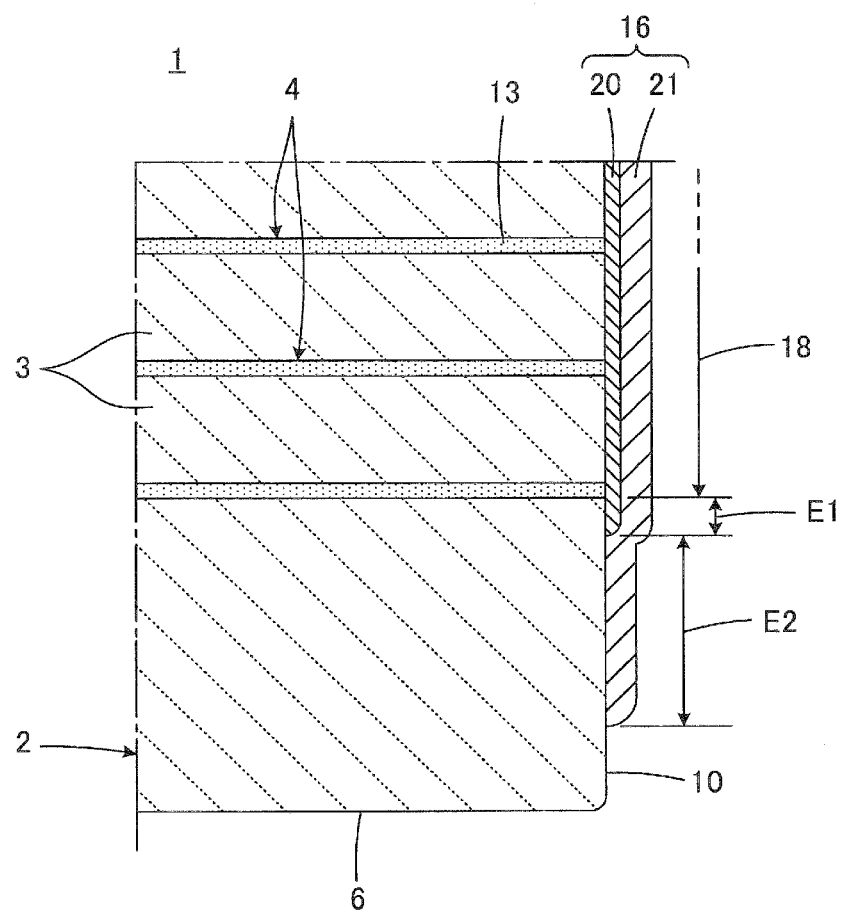
FIG. 5 is an enlarged cross-sectional view taken along line L2-L2 in FIG. 1.

Referring to FIGS. 4 and 5, the first outer electrode 16 includes a first plating layer 20 and a second plating layer 21 disposed on the first plating layer 20. The first plating layer 20 is formed directly on the first end surface 10, a portion of the first lateral surface 8, and a portion of the second lateral surface 9 of the component body 2, the first lateral surface 8 and the second lateral surface 9 being adjacent to the first end surface 10. The first plating layer 20 is formed by electroless plating so as to cover the first exposed portion distribution region 18. The second plating layer 21 is formed by electrolytic plating so as to cover the first plating layer 20.

Herein, a distance from an edge of the first exposed portion distribution region 18 to an edge of the first plating layer 20 is defined as an amount of extension of first plating. A distance from the edge of the first plating layer 20 to an edge of the second plating layer 21 is defined as an amount of extension of second plating. In FIGS. 4 and 5, the amount of extension of first plating is denoted by E1 and the amount of extension of second plating is denoted by E2.

In various preferred embodiments of the present invention, in order to increase a force with which the outer electrodes 16 and 17 are joined to the component body 2 and to achieve an effect of preventing separation of the outer electrodes 16 and 17, as a result of experimental examples described below, it was discovered and confirmed that the amount of extension of first plating E1 and the amount of extension of second plating E2 are selected so as to satisfy the relationship described below.

$$E1/(E1+E2) \leq 20\%$$

Note that FIGS. 4 and 5 show a state where the first plating layer 20 is formed so as to cover not only the first exposed portion distribution region 18 but also a peripheral portion of the first exposed portion distribution region 18. Alternatively, the first plating layer 20 may be formed only on the first exposed portion distribution region 18. In other words, the amount of extension of first plating E1 may be zero.

In FIG. 4, the amount of extension of first plating E1 and the amount of extension of second plating E2 are each shown as a distance measured in the plane direction of the first inner electrodes 4. On the other hand, in FIG. 5, the amount of extension of first plating E1 and the amount of extension of second plating E2 are each shown as a distance measured in the thickness direction of the first inner electrodes 4. In the plating steps of forming the first plating layer 20 and the second plating layer 21, the plating is isotropically deposited. Accordingly, the amount of extension of first plating E1 and the amount of extension of second plating E2 do not substantially change even when they are measured as the distances shown in FIG. 4 or even when they are measured as the distances shown in FIG. 5.

The distances are measured by using the following method. Specifically, the monolithic ceramic capacitor 1 is polished to expose a particular cross section that passes through the center of the component body 2, as shown in FIG. 4 or 5. Subsequently, an elemental mapping image of the exposed cross section is obtained by using an energy-dispersive X-ray spectrometer (EDX) coupled with a scanning electron microscope (SEM). The first plating layer 20 and the second plating layer are identified from the elemental mapping image, and the amount of extension of first plating E1 and the amount of extension of second plating E2 are measured. Note that quantitative analysis of elements contained in the first plating layer 20 and the second plating layer 21 can be performed by energy-dispersive X-ray spectrometry.

The plating steps of forming the outer electrodes 16 and 17 are performed, for example, as follows.

The first plating layer 20 preferably includes a Ni—P plating film. The phosphorus (P) content of the Ni—P plating film preferably is about 2% to about 18% by weight, for example. As a pretreatment of electroless plating, a step of imparting a Pd catalyst and a step of washing with pure water are preferably performed. Electroless Ni—P plating is then performed to form the first plating layer 20 constituted by a Ni—P plating film having a P content of, for example, about 9% by weight or more. In this step, the first plating layer 20 constitutes a homogeneous and dense film while physically connecting plating deposits formed on adjacent exposed portions of the inner electrodes 4 and 5 to each other.

The P content of the first plating layer 20 is measured by EDX quantitative analysis. Specifically, a particular cross section that passes through the center of the component body 2 is exposed, and the P content is measured, as a typical value, at one point of the center in the thickness direction of the first plating layer 20. Elements selected in the quantitative analysis are Ni and P. The term "P content" refers to a P content determined when the sum of the amount of Ni and the amount of P is defined as a total amount.

In order to enhance the effect of preventing moisture from infiltrating inside the component body 2 while suppressing the amount of extension E1 of the first plating layer 20 having a lower joining force than the second plating layer 21, the thickness of the first plating layer 20 is preferably large. Specifically, the first plating layer 20 is preferably formed such that the amount of extension of first plating E1 becomes smaller than the thickness of the first plating layer 20.

In the step of imparting a Pd catalyst described above, Ni contained in the inner electrodes 4 and 5 is replaced by Pd, thus improving the catalytic performance for a reducing agent of electroless Ni—P plating. However, the step of imparting a Pd catalyst may be omitted because Ni itself has a catalytic property.

After the step of electroless Ni—P plating, a washing step with pure water is performed.

Subsequently, a heat treatment step may be performed. The heat treatment temperature preferably is, for example, about 600° C. or higher, and preferably about 800° C. or higher. This heat treatment causes interdiffusion between the first inner electrode 4 and the first plating layer 20 and between the second inner electrode 5 and the first plating layer 20. Since a volume expansion of a metal occurs in this interdiffused portion, gaps that are present at the interfaces between the ceramic layers 3, the inner electrodes 4 and 5, and the first plating layer 20 is advantageously filled with the metal. As a result, the effect of preventing moisture from infiltrating inside the component body 2 is achieved.

Next, the second plating layer 21 is formed by electrolytic plating. The second plating layer 21 includes, for example, a Ni plating film. Since the second plating layer 21 is formed by electrolytic plating, the second plating layer 21 is efficiently formed.

After the step of electrolytic Ni plating, a washing step with pure water is performed.

After the formation of the second plating layer 21, a step of forming another plating layer may be further performed. For example, a Sn plating film may be formed on the Ni plating film. The Sn plating film improves solder wettability of the outer electrodes 16 and 17. Similarly, after the Sn plating film is formed by electrolytic plating, a washing step with pure water is performed, and a drying step is subsequently performed.

In order to significantly reduce or prevent an increase in the external dimensions of the electronic component, that is, the monolithic ceramic capacitor 1 while making the amount of extension E2 of the second plating layer 21 large, the second plating layer 21 having a higher joining force than the first plating layer 20, the thickness of the second plating layer 21 is preferably small. Specifically, the second plating layer 21 is preferably formed such that the amount of extension of second plating E2 becomes larger than the thickness of the second plating layer 21.

The monolithic ceramic capacitor 1 shown in FIG. 1 is preferably produced as described above.

When the first plating layer 20 includes a Ni—P plating film as described above, a force with which the outer electrodes 16 and 17 are fixed to the component body 2 is significantly increased. In particular, when the P content is high, for example, about 9% by weight or more, the hardness of the plating film increases. Accordingly, when the Ni—P film conforms to fine irregularities on a ceramic surface, the stress of the film is decreased and thus a high anchoring effect is achieved. Consequently, the joining strength of the first plating layer 20 to the exposed portions of the inner electrodes 4 and 5 is improved as a whole. Furthermore, separation at the interface between the first plating layer 20 and ceramic portions located at peripheral edges of the exposed portions of the inner electrodes 4 and 5 does not easily occur, thus improving moisture-proof reliability in mounting. In order to obtain sufficient moisture-proof reliability, the P content is preferably about 9% by weight or more, for example.

When the P content is high, corrosion resistance of the plating film is also improved. Thus, corrosion resistance of the first plating layer 20 is improved, and also in this respect, moisture-proof reliability is improved.

The Ni—P plating film constituting the first plating layer 20 is more preferably amorphous. In the case of an amorphous film, the conforming property to irregularities on a ceramic surface becomes high. As a result, the anchoring effect becomes higher and the fixing force is further increased. Furthermore, gaps between the first plating layer 20 and the first inner electrode 4 and between the first plating layer 20 and the second inner electrode 5 are substantially eliminated. For example, a good sealing property to water vapor is obtained and moisture-proof reliability is further improved. When the P content exceeds about 8% to about 9% by weight, for example, the Ni—P plating film becomes amorphous. Also in this respect, the P content of the Ni—P plating film is preferably about 9% by weight or more, for example.

As described above, when a Ni—P plating film has a P content of about 9% by weight or more, for example, the Ni—P plating film becomes amorphous and has a high hardness. Accordingly, cracks are easily generated in such a Ni—P plating film. In particular, in the case where cracks are generated in the vicinity of an edge of the first plating layer 20, which is a Ni—P plating film, and a cracked edge portion is not connected to the first inner electrode 4 or the second inner electrode 5, the first outer electrode 16 or the second outer electrode 17 is easily separated from the cracked edge portion. However, this drawback can be compensated for by providing the second plating layer 21 that includes a Ni plating film. In particular, a Ni plating film that does not contain P is relatively flexible. Therefore, by protecting the first plating layer 20 with the second plating layer 21, the first plating layer 20 is not easily cracked. In particular, even when the P content of the Ni—P plating film constituting the first plating layer 20 is about 9% by weight or more, for example, it is believed that the generation of cracks in the vicinity of an edge of the first plating layer 20 is prevented by forming a phosphorus-free Ni plating film constituting the second plating layer 21 so as to satisfy the relationship E1/(E1+E2) ≤20%. As a result, separation of an outer electrode is prevented as described in Experimental Examples below (P content: about 11% and about 13% by weight, for example).

Next, on the basis of the first preferred embodiment described above, a description will be made of Experimental Examples 1 and 2 in which the relationship between the occurrence of separation of the outer electrodes 16 and 17 and the amount of extension of first plating E1 and the amount of extension of second plating E2.

EXPERIMENTAL EXAMPLE 1

A component body for a monolithic ceramic capacitor was prepared. The component body had a planar dimension of approximately 1.0 mm×0.5 mm, and included ceramic layers composed of a barium titanate-based dielectric ceramic and inner electrodes containing Ni as a main component. In this component body, the ceramic layers between the inner electrodes each had a thickness of about 1 μm, each of the inner electrodes had a thickness of about 1 μm, and outer layer portions that did not include the inner electrodes each had a thickness of about 50 μm, for example. As a pretreatment of a plating process described below, barrel polishing was performed on the component body so that exposed portions of the inner electrodes were reliably exposed. Subsequently, a washing step with pure water was performed.

Next, a step of imparting a Pd catalyst was performed for the component body. In the step of imparting a Pd catalyst, an aqueous solution of palladium chloride (Pd concentration: 100 ppm, pH: 2.5, temperature: 25° C.) was prepared, and the component body was immersed in the aqueous solution for three minutes. After the immersion, the component body was taken out from the aqueous solution of palladium chloride and washed with pure water.

Next, a rotary barrel having a drum volume of about 300 cc and a diameter of about 70 mm was prepared, and about 20 mL of the component bodies were charged in the rotary barrel. The rotary barrel was then immersed in an electroless Ni—P plating bath, and an electroless plating process was performed at a barrel rotation speed of about 20 rpm for a predetermined time. In this step, the pH, the concentration of sodium hypophosphite, the temperature, the concentration of Ni, the concentration of citric acid etc. of the electroless Ni—P plating bath were adjusted such that the P content became about 11% by weight. In this Experimental Example, an electroless Ni—P plating bath containing about 0.1 mol/L of nickel sulfate, about 0.2 mol/L of sodium hypophosphite, about 0.5 mol/L of citric acid, and about 0.5 mol/L of ammonium sulfate was used. The pH of this electroless Ni—P plating bath was adjusted to 8.0 by using sulfuric acid and sodium hydroxide as pH adjusting agents. The temperature of the electroless Ni—P plating bath was set to about 90° C. After the electroless Ni—P plating process, washing with pure water was performed.

A first plating layer constituted by a Ni—P plating film having a P content of about 11% by weight was formed as described above. Here, the distance from an edge of the exposed portion distribution region to an edge of the first plating layer, that is, the amount of extension of first plating was changed by varying the electroless plating process time, as shown in the column of "E1" in Table 1.

Next, in addition to about 20 mL of the component bodies, about 40 mL of Sn—Ag—Cu media having a diameter of about 0.45 mm and about 50 cc of stirring balls formed of iron balls covered with nylon and having a diameter of about 8.0 mm were charged in the rotary barrel used in the above process. An electrolytic Ni plating process was performed by using the rotary barrel at a barrel rotation speed of about 20 rpm for a predetermined time. A Watts bath (nickel sulfate: about 300 g/L, nickel chloride: about 45 g/L, boric acid: about 40 mg/L) whose pH was adjusted to 4.0 and whose temperature was adjusted to about 55° C. was used as an electrolytic Ni plating bath. After the electrolytic Ni plating process, washing with pure water was performed.

A second plating layer constituted by an electrolytic Ni plating film that did not substantially contain P was formed on the first plating layer as described above. Here, the distance from the edge of the first plating layer to an edge of the second plating layer, that is, the amount of extension of second plating was changed by varying the electrolytic plating process time, as shown in the column of "E2" in Table 1. Note that the sum of the amount of extension of first plating E1 and the amount of extension of second plating E2 was controlled to 30 μm. The total thickness of the first plating layer and the second plating layer, that is, the thickness of an outer electrode was in the range of about 5 μm to about 15 μm, for example.

Samples of monolithic ceramic capacitors were obtained as described above. For 1,000 samples, the occurrence or non-occurrence of separation of an outer electrode, that is, a partial detachment of an outer electrode due to the separation of a plating layer was examined by observing the appearance of each surface of the monolithic ceramic capacitors on which an edge of an outer electrode was formed. In this examination, when the dimension of the partial detachment of the outer electrode was about 10 μm or more, it was determined that separation of the outer electrode occurred (this also applies to experimental examples described below). The results are shown in the column of the "occurrence rate of separation" of Table 1. Regarding E1 and E2, five samples were selected from the samples, and each of E1 and E2 was measured at one position in accordance with the method described above. The average of the five samples was determined.

TABLE 1

| Sample No. | E1 | E2 | E1/(E1 + E2) × 100 | Occurrence rate of separation |
|---|---|---|---|---|
| 1 | 0 | 30 | 0 | 0/1000 |
| 2 | 3 | 27 | 10 | 0/1000 |
| 3 | 6 | 24 | 20 | 0/1000 |
| *4 | 8 | 22 | 27 | 2/1000 |
| *5 | 10 | 20 | 33 | 5/1000 |
| *6 | 12 | 18 | 40 | 7/1000 |

In Table 1, sample numbers marked with * are Comparative Examples that are out of the range of preferred embodiments of the present invention.

As shown in Table 1, it was discovered and confirmed that separation of an outer electrode did not occur in Sample Nos. 1 to 3, in which the numerical value of "E1/(E1+E2)×100" was or less, that is, the value represented by (amount of extension of first plating)/{(amount of extension of first plating)+(amount of extension of second plating)} was about 20% or less.

EXPERIMENTAL EXAMPLE 2

A component body for a monolithic ceramic capacitor was prepared. The component body had a planar dimension of approximately 0.6 mm×0.3 mm and included ceramic layers composed of a barium titanate-based dielectric ceramic and inner electrodes containing Ni as a main component. In this component body, the ceramic layers between the inner electrodes each had a thickness of about 1 μm, each of the inner electrodes had a thickness of about 0.7 μm, and outer layer portions that did not include the inner electrodes each had a thickness of about 50 μm.

A first plating layer constituted by a Ni—P plating film having a P content of about 11% by weight was formed on the component body through the steps similar to those in Experimental Example 1. Here, the distance from an edge of the exposed portion distribution region to an edge of the first plating layer, that is, the amount of extension of first plating was changed by varying the electroless plating process time for forming the first plating layer, as shown in the column of "E1" in Table 2.

Next, a second plating layer constituted by an electrolytic Ni plating film that did not substantially contain P was formed on the first plating layer through the steps similar to those in Experimental Example 1. Here, the distance from the edge of the first plating layer to an edge of the second plating layer, that is, the amount of extension of second plating was changed by varying the electrolytic plating process time for forming the second plating layer, as shown in the column of "E2" in Table 2. Note that the sum of the amount of extension of first plating E1 and the amount of extension of second plating E2 was controlled to about 20 μm. The total thickness of the first plating layer and the second plating layer, that is, the thickness of an outer electrode was in the range of about 5 μm to about 15 μm, for example.

Samples of monolithic ceramic capacitors were obtained as described above. For 1,000 samples, the occurrence or non-occurrence of separation of an outer electrode, that is, a partial detachment of an outer electrode due to the separation of a plating layer was examined by observing the appearance of each surface of the monolithic ceramic capacitors on which an edge of an outer electrode was formed. The results are shown in the column of the "occurrence rate of separation" of Table 2.

TABLE 2

| Sample No. | E1 | E2 | E1/(E1+E2) × 100 | Occurrence rate of separation |
|---|---|---|---|---|
| 11 | 0 | 20 | 0 | 0/1000 |
| 12 | 2 | 18 | 10 | 0/1000 |
| 13 | 4 | 16 | 20 | 0/1000 |
| *14 | 8 | 12 | 40 | 1/1000 |
| *15 | 10 | 10 | 50 | 3/1000 |
| *16 | 12 | 8 | 60 | 3/1000 |

In Table 2, sample numbers marked with * are Comparative Examples that are out of the range of preferred embodiments of the present invention.

As shown in Table 2, it was discovered and confirmed that separation of an outer electrode did not occur in Sample Nos. 11 to 13, in which the numerical value of "E1/(E1+E2)×100" was 20 or less, that is, the value represented by (amount of extension of first plating)/{(amount of extension of first plating)+(amount of extension of second plating)} was about 20% or less.

Second Preferred Embodiment

A three-terminal-type monolithic ceramic capacitor 31 according to a second preferred embodiment of the present invention will now be described with reference to FIGS. 6 to 9. The monolithic ceramic capacitor 31 includes a component body 32 whose appearance is shown in FIG. 8. The component body 32 includes a plurality of stacked ceramic layers 33, first inner electrodes 34 and second inner electrodes 35 that define and serve as a plurality of electrode layers arranged along the ceramic layers 33, a first auxiliary electrode 36, a second auxiliary electrode 37, a third auxiliary electrode 38, and a fourth auxiliary electrode 39. The inner electrodes 34 and 35 are disposed at interfaces between the ceramic layers 33. On the other hand, some of the auxiliary electrodes 36 to 39 are disposed at interfaces between the ceramic layers 33 and some of the auxiliary electrodes 36 to 39 are disposed on outer surfaces of the component body 32 and function as surface electrodes.

The component body 32 has a rectangular or substantially rectangular parallelepiped shape including a first main surface 40 and a second main surface 41 that extend in a direction in which the ceramic layers 33 extend, a first lateral surface 42, a second lateral surface 43, a first end surface 44, and a second end surface 45 that extend in a stacking direction of the ceramic layers 33. The monolithic ceramic capacitor 31 is preferably designed to be mounted so that the inner electrodes 34 and 35 are directed in a direction parallel or substantially parallel to a mounting substrate (not shown). Accordingly, the first main surface 40 or the second main surface 41 is directed to the mounting substrate side.

Figure 7A:
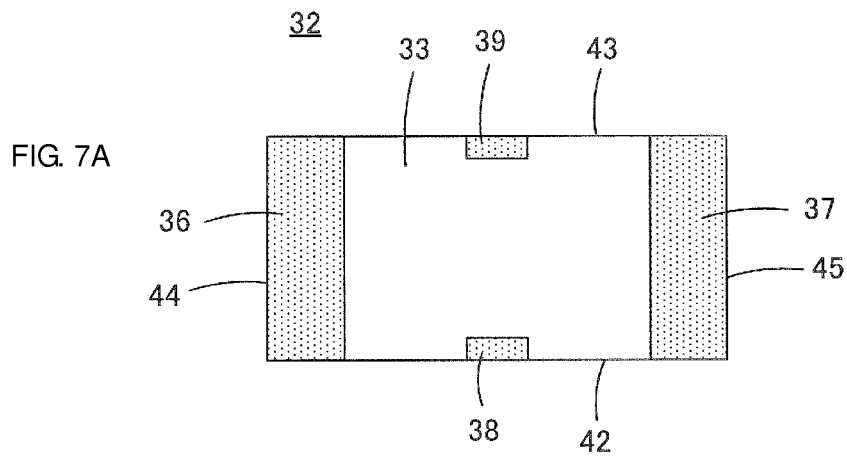
FIG. 7A is a plan view illustrating the structure of a component body included in the monolithic ceramic capacitor shown in FIG. 6 and shows a surface through which auxiliary electrodes pass.
Figure 8:
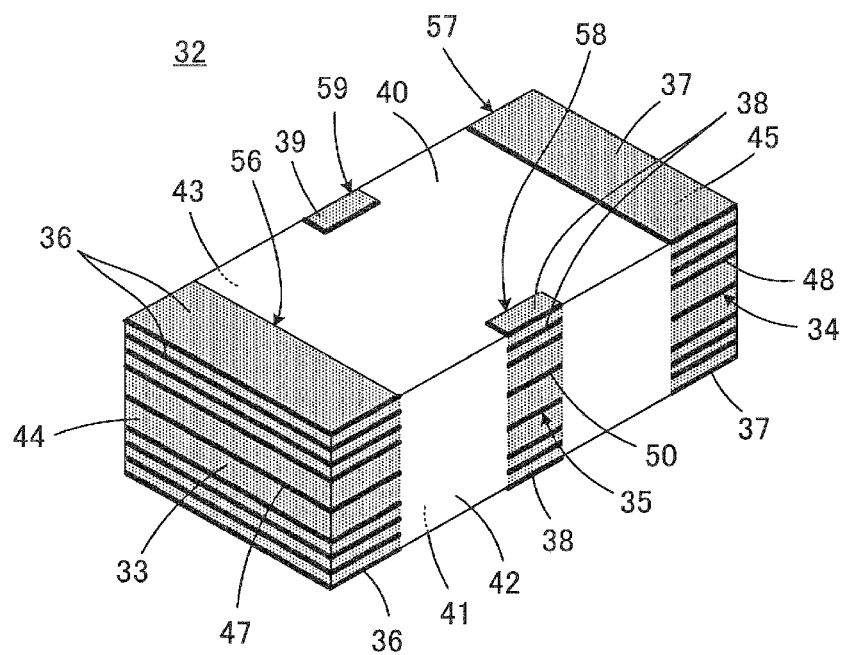
FIG. 8 is a perspective view showing an appearance of a component body included in the monolithic ceramic capacitor shown in FIG. 6.

Referring to FIG. 7A, the first auxiliary electrode 36 is disposed on the first end surface 44 side, and edges of the first auxiliary electrode 36 are exposed at the first end surface 44, a portion of the first lateral surface 42, and a portion of the second lateral surface 43, the first lateral surface 42 and the second lateral surface 43 being adjacent to the first end surface 44, and constitute an exposed portion in these areas. The second auxiliary electrode 37 is disposed on the second end surface 45 side, and edges of the second auxiliary electrode 37 are exposed at the second end surface 45, a portion of the first lateral surface 42, and a portion of the second lateral surface 43, the first lateral surface 42 and the second lateral surface 43 being adjacent to the second end surface 45, and constitute an exposed portion in these areas.

The third auxiliary electrode 38 is disposed on the first lateral surface 42 side, and an edge of the third auxiliary electrode 38 is exposed at the first lateral surface 42 and constitutes an exposed portion in this area. The fourth auxiliary electrode 39 is disposed on the second lateral surface side, and an edge of the fourth auxiliary electrode 39 is exposed at the second lateral surface 43 and constitutes an exposed portion in this area.

Regarding the auxiliary electrodes 36 to 39 functioning as surface electrodes disposed on main surfaces exposed at the outside of ceramic layers 33 arranged as outermost layers, i.e., disposed on the first main surface 40 and the second main surface 41 of the component body 32, not only edges but also the entire main surfaces of the auxiliary electrodes 36 to 39 constitute the exposed portions.

FIG. 8 also shows the configuration of the exposed portions provided by the auxiliary electrodes 36 to 39.

Figure 7B:
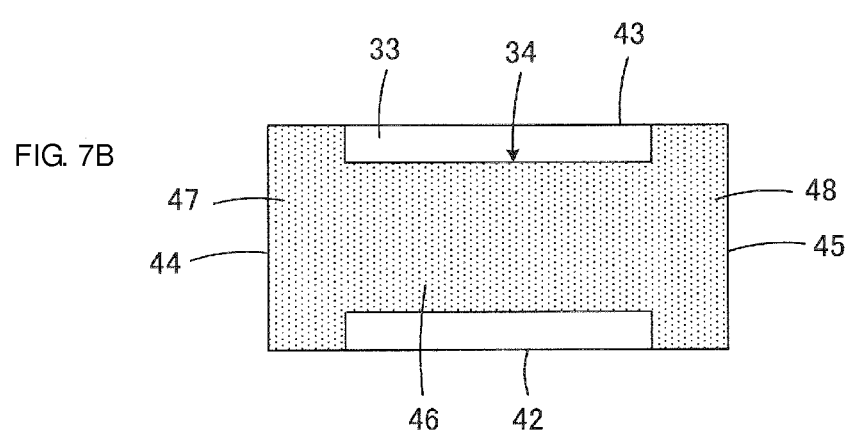
FIG. 7B is a plan view illustrating the structure of a component body included in the monolithic ceramic capacitor shown in FIG. 6 and shows a surface through which a first inner electrode passes.

As shown in FIG. 7B, the first inner electrode 34 includes a first extending portion 47, a second extending portion 48, and a capacitance-generating portion 46 that constitutes a main portion of the first inner electrode 34. The first extending portion 47 is exposed at the first end surface 44, a portion of the first lateral surface 42, and a portion of the second lateral surface 43, the first lateral surface 42 and the second lateral surface 43 being adjacent to the first end surface 44, and constitutes an exposed portion in these areas. The second extending portion 48 is exposed at the second end surface 45, a portion of the first lateral surface 42, and a portion of the second lateral surface 43, the first lateral surface 42 and the second lateral surface 43 being adjacent to the second end surface 45, and constitutes an exposed portion in these areas. FIG. 8 also shows the configuration of the exposed portions.

Figure 7C:
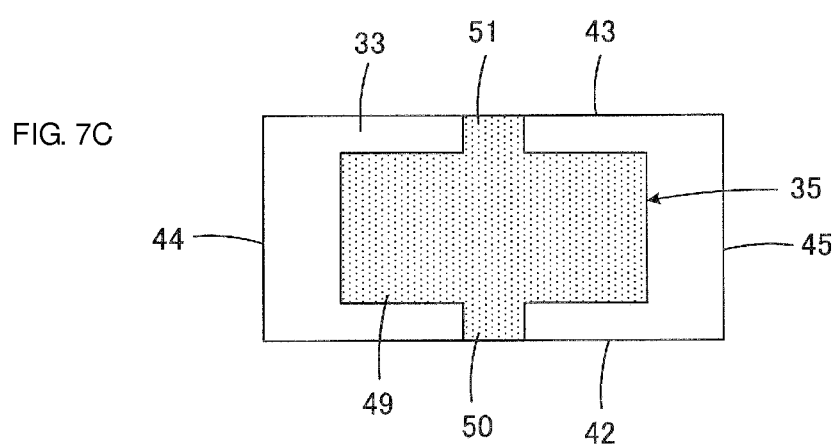
FIG. 7C is a plan view illustrating the structure of a component body included in the monolithic ceramic capacitor shown in FIG. 6 and shows a surface through which a second inner electrode passes.

As shown in FIG. 7C, the second inner electrode 35 includes a first extending portion 50, a second extending portion 51, and a capacitance-generating portion 49 that constitutes a main portion of the second inner electrode 35. The first extending portion 50 is exposed at a portion of the first lateral surface 42 and constitutes an exposed portion in this area. The second extending portion 51 is exposed at a portion of the second lateral surface 43 and constitutes an exposed portion in this area. FIG. 8 also shows the configuration of the exposed portions.

The component body 32 described above is produced by using a stacking technique similar to that used in the production of the component body 2 in the first preferred embodiment, though a detailed description is omitted. A stacking preferred embodiment particular to the second preferred embodiment will be described. The plurality of first inner electrodes 34 and the plurality of second inner electrodes 35 are stacked so as to be alternately arranged in a stacking direction, and the plurality of auxiliary electrodes 36 to 39 are arranged on both end portions of the component body in the stacking direction. The auxiliary electrodes 36 to 39 are further arranged on the first main surface 40 and the second main surface 41 of the component body 32.

Figure 6:
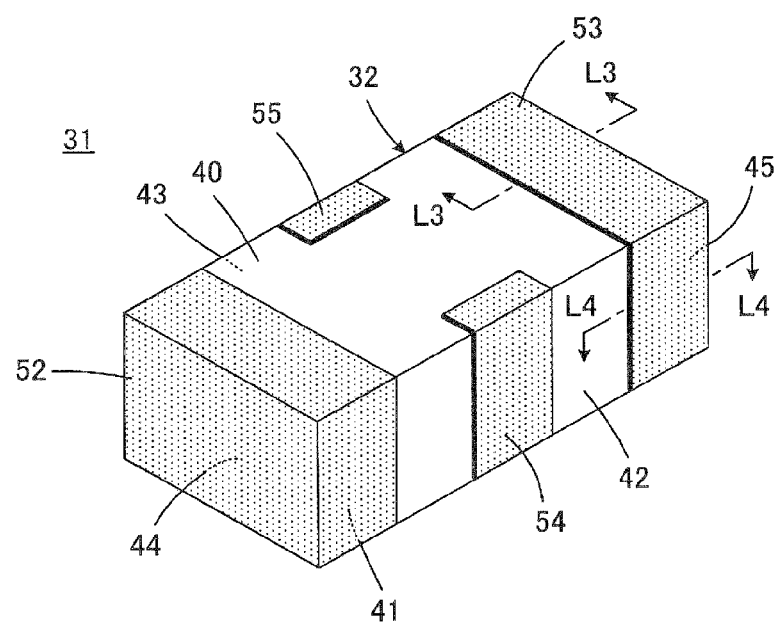
FIG. 6 is a perspective view showing an appearance of a monolithic ceramic capacitor which is a three-terminal-type monolithic ceramic electronic component according to a second preferred embodiment of the present invention.

After the component body 32 is produced, in order to obtain the monolithic ceramic capacitor 31 shown in FIG. 6, a first outer electrode 52 that is electrically connected to the first extending portions 47 of the first inner electrodes 34, a second outer electrode 53 that is electrically connected to the second extending portions 48 of the first inner electrodes 34, a third outer electrode 54 that is electrically connected to the first extending portions 50 of the second inner electrodes 35, and a fourth outer electrode 55 that is electrically connected to the second extending portions 51 of the second inner electrodes 35 are formed. The structures of the outer electrodes 52 to 55 and a method for forming the outer electrodes 52 to 55 will now be described.

As shown in FIG. 8, the exposed portions provided by the first extending portions 47 of the plurality of first inner electrodes 34 and the first auxiliary electrodes 36 are aligned in the stacking direction of the ceramic layers 33 and define a first exposed portion distribution region 56. The first exposed portion distribution region 56 extends over the first end surface 44, a portion of the first main surface 40, a portion of the second main surface 41, a portion of the first lateral surface 42, and a portion of the second lateral surface 43, the first main surface 40, the second main surface 41, the first lateral surface 42, and the second lateral surface 43 being adjacent to the first end surface 44.

The exposed portions provided by the second extending portions 48 of the plurality of first inner electrodes 34 and the second auxiliary electrodes 37 are aligned in the stacking direction of the ceramic layers 33 and define a second exposed portion distribution region 57. The second exposed portion distribution region 57 extends over the second end surface 45, a portion of the first main surface 40, a portion of the second main surface 41, a portion of the first lateral surface 42, and a portion of the second lateral surface 43, the first main surface 40, the second main surface 41, the first lateral surface 42, and the second lateral surface 43 being adjacent to the second end surface 45.

The exposed portions provided by the first extending portions 50 of the plurality of second inner electrodes 35 and the third auxiliary electrodes 38 are aligned in the stacking direction of the ceramic layers 33 and define a third exposed portion distribution region 58. The third exposed portion distribution region 58 extends to the first lateral surface 42, a portion of the first main surface 40, and a portion of the second main surface 41, the first main surface 40 and the second main surface 41 being adjacent to the first lateral surface 42.

The exposed portions provided by the second extending portions 51 of the plurality of second inner electrodes 35 and the fourth auxiliary electrodes 39 are aligned in the stacking direction of the ceramic layers 33 and define a fourth exposed portion distribution region 59. The fourth exposed portion distribution region 59 extends to the second lateral surface 43, a portion of the first main surface 40, and a portion of the second main surface 41, the first main surface 40 and the second main surface 41 being adjacent to the second lateral surface 43.

The first outer electrode 52 to the fourth outer electrode 55 preferably are formed at the same time and have the same cross-sectional structure. The second outer electrode 53 shown in FIG. 9 will be described in more detail, and a detailed description of the other outer electrodes 52, 54, and 55 is omitted.

Figure 9:
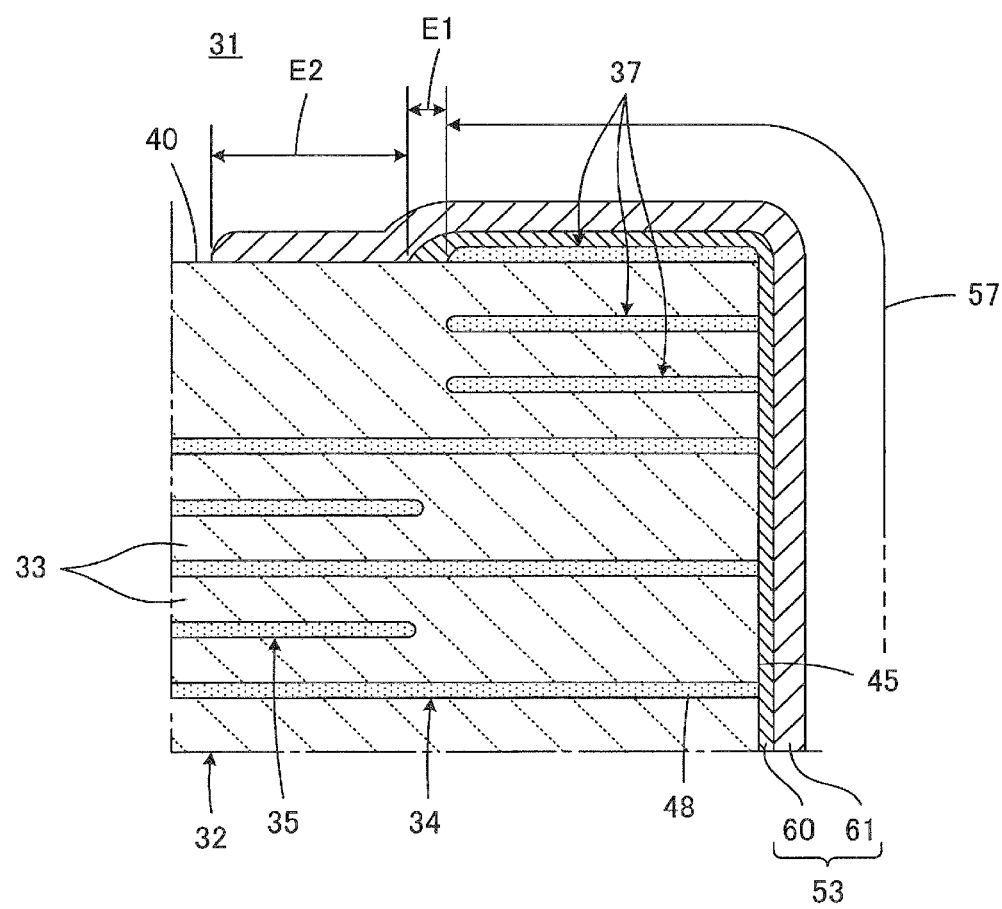
FIG. 9 is an enlarged cross-sectional view taken along line L3-L3 in FIG. 6.

Referring to FIG. 9, the second outer electrode 53 includes a first plating layer 60 and a second plating layer 61 disposed on the first plating layer 60. The first plating layer 60 is formed directly on the second end surface 45, a portion of the first main surface 40, a portion of the second main surface 41, a portion of the first lateral surface 42, and a portion of the second lateral surface 43 of the component body 32, the first main surface 40, the second main surface 41, the first lateral surface 42, and the second lateral surface 43 being adjacent to the second end surface 45. The first plating layer 60 is formed by electroless plating so as to cover the second exposed portion distribution region 57. The second plating layer 61 is formed by electrolytic plating so as to cover the first plating layer 60.

Herein, a distance from an edge of the second exposed portion distribution region 57 to an edge of the first plating layer 60 is defined as an amount of extension of first plating. A distance from the edge of the first plating layer 60 to an edge of the second plating layer 61 is defined as an amount of extension of second plating. In FIG. 9, the amount of extension of first plating is denoted by E1 and the amount of extension of second plating is denoted by E2.

Also in the present preferred embodiment, in order to increase the force with which the outer electrodes 52 to 55 are fixed to the component body 32 and to achieve an effect of preventing separation of the outer electrodes 52 to 55, the amount of extension of first plating E1 and the amount of extension of second plating E2 are selected preferably so as to satisfy the following relationship:

$$E1/(E1+E2) \leq 20\%$$

In FIGS. 4 and 5, the amount of extension of first plating E1 and the amount of extension of second plating E2 are distances measured from an exposed portion of the inner electrode 4. In contrast, in FIG. 9, which shows a cross section taken along line L3-L3 in FIG. 6, the amount of extension of first plating E1 and the amount of extension of second plating E2 are distances measured from an end portion of the second auxiliary electrode 37 located on an outer surface of the component body 32. Also in this second preferred embodiment, for example, when a cross section taken along line L4-L4 in FIG. 6 is shown, a cross section substantially similar to that shown in FIG. 4 appears. As described above, since the deposition of plating isotropically proceeds, the amount of extension of first plating E1 and the amount of extension of second plating E2 do not substantially change on any cross section.

The outer electrodes 52 to 55 are formed as described above. Thus, the monolithic ceramic capacitor 31 shown in FIG. 6 is produced. It is to be understood that matters that have been described in the first preferred embodiment but that have not been described in the second preferred embodiment and that can be applied to the second preferred embodiment apply also to the second preferred embodiment.

Next, on the basis of the second preferred embodiment described above, a description will be made of Experimental Example 3 in which the relationship between the occurrence of separation of the outer electrodes 52 to 55 and the amount of extension of first plating E1 and the amount of extension of second plating E2.

EXPERIMENTAL EXAMPLE 3

A component body for a monolithic ceramic capacitor was prepared. The component body had a planar dimension of approximately 1.0 mm×0.5 mm and included ceramic layers composed of a barium titanate-based dielectric ceramic and inner electrodes containing Ni as a main component. In this component body, the ceramic layers between the inner electrodes each had a thickness of about 1 μm, each of the inner electrodes had a thickness of about 1 μm, and outer layer portions that did not include the inner electrodes each had a thickness of about 50 μm.

A first plating layer constituted by a Ni—P plating film having a P content of about 11% by weight was formed on the component body through the steps similar to those in Experimental Example 1. Here, the distance from an edge of the exposed portion distribution region to an edge of the first plating layer, that is, the amount of extension of first plating was changed by varying the electroless plating process time for forming the first plating layer, as shown in the column of "E1" in Table 3.

Next, a second plating layer constituted by an electrolytic Ni plating film that did not substantially contain P was formed on the first plating layer through the steps similar to those in Experimental Example 1. Here, the distance from the edge of the first plating layer to an edge of the second plating layer, that is, the amount of extension of second plating was changed by varying the electrolytic plating process time for forming the second plating layer, as shown in the column of "E2" in Table 3. Note that the sum of the amount of extension of first plating E1 and the amount of extension of second plating E2 was controlled to about 30 μm. The total thickness of the first plating layer and the second plating layer, that is, the thickness of an outer electrode was in the range of 5 to 15 μm.

Samples of monolithic ceramic capacitors were obtained as described above. For 1,000 samples, the occurrence or non-occurrence of separation of an outer electrode, that is, a partial detachment of an outer electrode due to the separation of a plating layer was examined by observing the appearance of each surface of the monolithic ceramic capacitors on which an edge of an outer electrode was formed. The results are shown in the column of the "occurrence rate of separation" of Table 3.

TABLE 3

| Sample No. | E1 | E2 | E1/(E1 + E2) × 100 | Occurrence rate of separation |
|---|---|---|---|---|
| 21 | 0 | 30 | 0 | 0/1000 |
| 22 | 2 | 28 | 7 | 0/1000 |
| 23 | 6 | 24 | 20 | 0/1000 |
| *24 | 7 | 23 | 23 | 1/1000 |
| *25 | 10 | 20 | 33 | 4/1000 |
| *26 | 13 | 17 | 43 | 6/1000 |

In Table 3, sample numbers marked with * are Comparative Examples that are out of the range of preferred embodiments of the present invention.

Referring to Table 3, it was discovered and confirmed that separation of an outer electrode did not occur in Sample Nos. 21 to 23, in which the numerical value of "E1/(E1+E2)×100" was about 20 or less, that is, the value represented by (amount of extension of first plating)/{(amount of extension of first plating)+(amount of extension of second plating)} was 20% or less.

Third Preferred Embodiment

Figure 11:
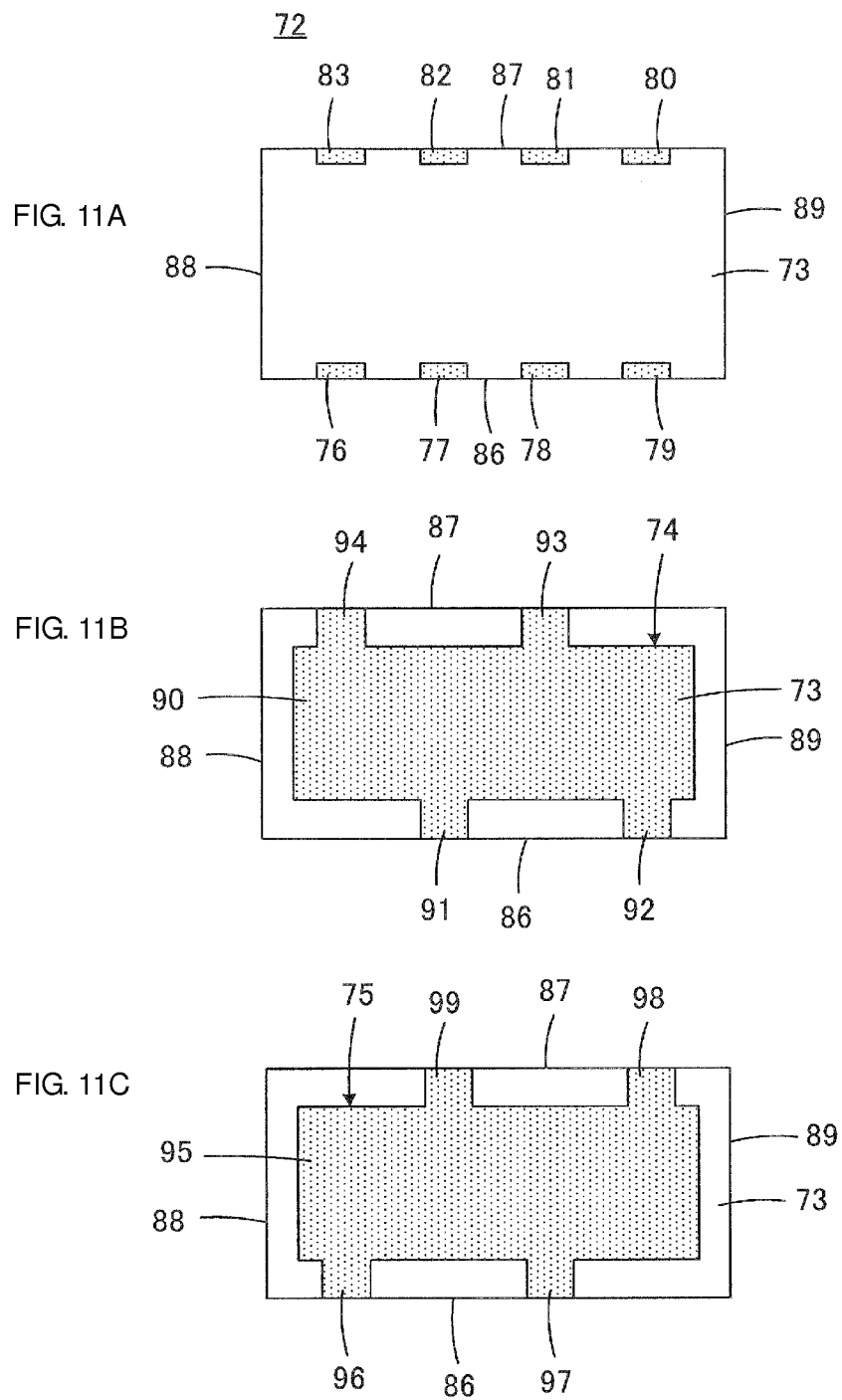
FIG. 11A is a plan view illustrating the structure of a component body included in the monolithic ceramic capacitor shown in FIG. 10 and shows a surface through which auxiliary electrodes pass.
FIG. 11B is a plan view illustrating the structure of a component body included in the monolithic ceramic capacitor shown in FIG. 10 and shows a surface through which a first inner electrode passes.
FIG. 11C is a plan view illustrating the structure of a component body included in the monolithic ceramic capacitor shown in FIG. 10 and shows a surface through which a second inner electrode passes.
Figure 12:
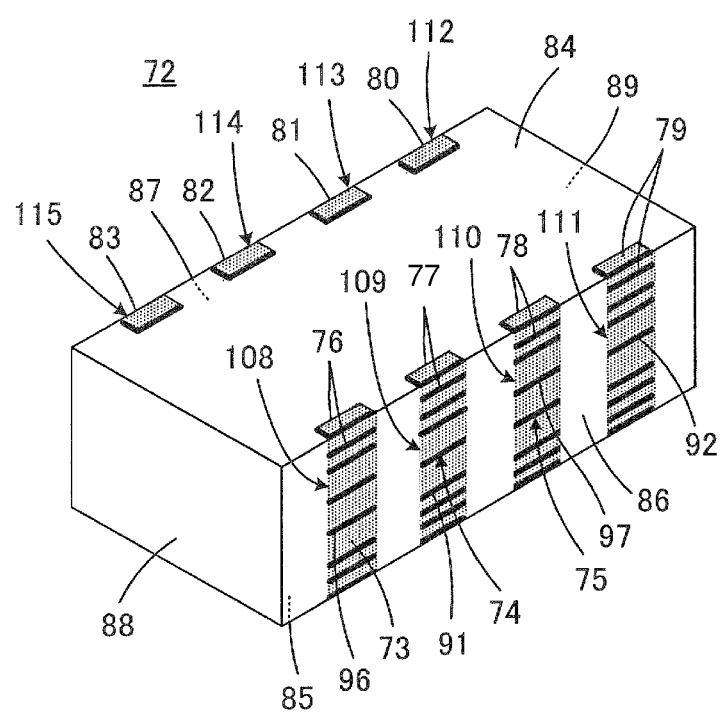
FIG. 12 is a perspective view showing an appearance of a component body included in the monolithic ceramic capacitor shown in FIG. 10.

An eight-terminal-type monolithic ceramic capacitor 71 according to a third preferred embodiment of the present invention will now be described with reference to FIGS. 10 to 12. The monolithic ceramic capacitor 71 includes a component body 72 whose appearance is shown in FIG. 12. The component body 72 includes a plurality of stacked ceramic layers 73, first inner electrodes 74 and second inner electrodes 75 that define and serve as a plurality of electrode layers arranged along the ceramic layers 73, a first auxiliary electrode 76, a second auxiliary electrode 77, a third auxiliary electrode 78, a fourth auxiliary electrode 79, a fifth auxiliary electrode 80, a sixth auxiliary electrode 81, a seventh auxiliary electrode 82, and an eighth auxiliary electrode 83. The inner electrodes 74 and 75 are disposed at interfaces between the ceramic layers 73. On the other hand, some of the auxiliary electrodes 76 to 83 are disposed at interfaces between the ceramic layers 73 and some of the auxiliary electrodes 76 to 83 are disposed on outer surfaces of the component body 72 and define and function as surface electrodes.

The component body 72 has a rectangular or substantially rectangular parallelepiped shape including a first main surface 84 and a second main surface 85 that extend in a direction in which the ceramic layers 73 extend, a first lateral surface 86, a second lateral surface 87, a first end surface 88, and a second end surface 89 that extend in a stacking direction of the ceramic layers 73. The monolithic ceramic capacitor 71 is usually designed to be mounted so that the inner electrodes 74 and 75 are directed in a direction parallel or substantially parallel to a mounting substrate (not shown). Accordingly, the first main surface 84 or the second main surface 85 is directed to the mounting substrate side.

Referring to FIG. 11A, the first to fourth auxiliary electrodes 76 to 79 are arranged along the first lateral surface at intervals, and edges of the first to fourth auxiliary electrodes 76 to 79 are exposed at the first lateral surface 86 and constitute exposed portions in these areas. The fifth to eighth auxiliary electrodes 80 to 83 are arranged along the second lateral surface 87 at intervals, and edges of the fifth to eighth auxiliary electrodes 80 to 83 are exposed at the second lateral surface 87 and constitute exposed portions in these areas. Regarding the auxiliary electrodes 76 to 83 functioning as surface electrodes disposed on main surfaces exposed at the outside of ceramic layers 73 located as outermost layers, i.e., disposed on the first main surface 84 and the second main surface 85 of the component body 72, not only edges but also the entire main surfaces of the auxiliary electrodes 76 to 83 constitute the exposed portions. FIG. 12 also shows the configuration of the exposed portions.

As shown in FIG. 11B, the first inner electrode 74 includes a first extending portion 91, a second extending portion 92, a third extending portion 93, a fourth extending portion 94, and a capacitance-generating portion 90 that constitutes a main portion of the first inner electrode 74. The first extending portion 91 and the second extending portion 92 are exposed at the first lateral surface 86 and constitute exposed portions in these areas. The third extending portion 93 and the fourth extending portion 94 are exposed at the second lateral surface 87 and constitute exposed portions in these areas. FIG. 12 also shows the configuration of the exposed portions.

As shown in FIG. 11C, the second inner electrode 75 includes a first extending portion 96, a second extending portion 97, a third extending portion 98, a fourth extending portion 99, and a capacitance-generating portion 95 that constitutes a main portion of the second inner electrode 75. The first extending portion 96 and the second extending portion 97 are exposed at the first lateral surface 86 and constitute exposed portions in these areas. The third extending portion 98 and the fourth extending portion 99 are exposed at the second lateral surface 87 and constitute exposed portions in these areas. FIG. 12 also shows the configuration of the exposed portions.

The component body 72 described above is produced by using a stacking technique similar to that used in the production of the component body 2 in the first preferred embodiment, though a detailed description is omitted. A stacking preferred embodiment particular to the third preferred embodiment will be described. The plurality of first inner electrodes 74 and the plurality of second inner electrodes 75 are stacked so as to be alternately arranged in a stacking direction, and the plurality of auxiliary electrodes 76 to 83 are arranged on both end portions of the stacking direction. The auxiliary electrodes 76 to 83 are further arranged on the first main surface 84 and the second main surface 85 of the component body 72.

Figure 10:
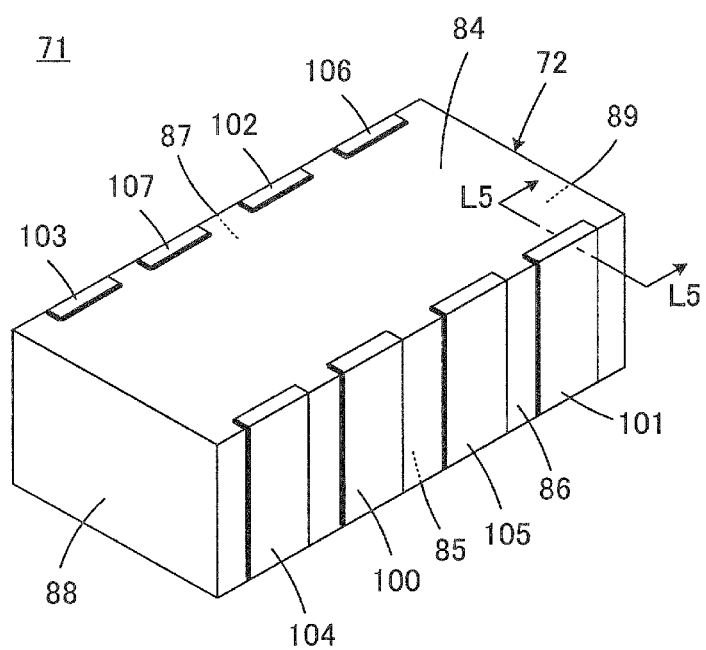
FIG. 10 is a perspective view showing an appearance of a monolithic ceramic capacitor which is an eight-terminal-type monolithic ceramic electronic component according to a third preferred embodiment of the present invention.

After the component body 72 is produced, in order to obtain the monolithic ceramic capacitor 71 shown in FIG. 10, first to fourth outer electrodes 100 to 103 that are respectively electrically connected to the first to fourth extending portions 91 to 94 of the first inner electrodes 74, and fifth to eighth outer electrodes 104 to 107 that are respectively electrically connected to the first to fourth extending portions 96 to 99 of the second inner electrodes 75 are formed. The structures of the outer electrodes 100 to 107 and a method for forming the outer electrodes 100 to 107 will now be described.

As shown in FIG. 12, the exposed portions provided by the first auxiliary electrodes 76 and the first extending portions 96 of the second inner electrodes 75 are aligned in the stacking direction of the ceramic layers 73 and define a first exposed portion distribution region 108. The first exposed portion distribution region 108 extends to the first lateral surface 86, a portion of the first main surface 84 and a portion of the second main surface 85, the first main surface 84 and the second main surface 85 being adjacent to the first lateral surface 86.

Similarly, a second exposed portion distribution region 109 is provided by the second auxiliary electrodes 77 and the first extending portions 91 of the first inner electrodes 74. A third exposed portion distribution region 110 is provided by the third auxiliary electrodes 78 and the second extending portions 97 of the second inner electrodes 75. A fourth exposed portion distribution region 111 is provided by the fourth auxiliary electrodes 79 and the second extending portions 92 of the first inner electrodes 74.

The exposed portions provided by the fifth auxiliary electrodes 80 and the third extending portions 98 of the second inner electrodes 75 are aligned in the stacking direction of the ceramic layers 73 and define a fifth exposed portion distribution region 112. The fifth exposed portion distribution region 112 extends to the second lateral surface 87, a portion of the first main surface 84 and a portion of the second main surface 85, the first main surface 84 and the second main surface 85 being adjacent to the second lateral surface 87.

Similarly, a sixth exposed portion distribution region 113 is provided by the sixth auxiliary electrodes 81 and the third extending portions 93 of the first inner electrodes 74. A seventh exposed portion distribution region 114 is provided by the seventh auxiliary electrodes 82 and the fourth extending portions 99 of the second inner electrodes 75. An eighth exposed portion distribution region 115 is provided by the eighth auxiliary electrodes 83 and the fourth extending portions 94 of the first inner electrodes 74.

The first outer electrode 100 to the eighth outer electrode 107 preferably are formed at the same time and have the same cross-sectional structure. When a cross section taken along line L5-L5 in FIG. 10 is shown, a cross section substantially similar to that shown in FIG. 9 appears, though the cross section is not shown.

For example, the first outer electrode 100 will be described. Also in the present preferred embodiment, the first outer electrode 100 includes a first plating layer formed by electroless plating so as to cover the second exposed portion distribution region 109, and a second plating layer formed by electrolytic plating so as to cover the first plating layer. The amount of extension of first plating E1 and the amount of extension of second plating E2 satisfy the following relationship:

$$E1/(E1+E2) \leq 20\%$$

where E1 represents the distance from an edge of the second exposed portion distribution region 109 to an edge of the first plating layer, and E2 represents the distance from the edge of the first plating layer to an edge of the second plating layer.

The outer electrodes 100 to 107 are formed as described above. Thus, the monolithic ceramic capacitor 71 shown in FIG. 10 is produced. It is to be understood that matters that have been described in the first preferred embodiment but that have not been described in the third preferred embodiment and that can be applied to the third preferred embodiment apply also to the third preferred embodiment.

Next, on the basis of the third preferred embodiment described above, a description will be made of Experimental Example 4 in which the relationship between the occurrence of separation of the outer electrodes 100 to 107 and the amount of extension of first plating E1 and the amount of extension of second plating E2.

EXPERIMENTAL EXAMPLE 4

A component body for a monolithic ceramic capacitor was prepared. The component body had a planar dimension of approximately 2.0 mm×1.2 mm and included ceramic layers composed of a barium titanate-based dielectric ceramic and inner electrodes containing Ni as a main component. In this component body, the ceramic layers between the inner electrodes each had a thickness of about 1 μm, each of the inner electrodes had a thickness of about 1 μm, and outer layer portions that did not include the inner electrodes each had a thickness of about 50 μm.

A first plating layer constituted by a Ni—P plating film having a P content of about 11% by weight was formed on the component body through the steps similar to those in Experimental Example 1. Here, the distance from an edge of the exposed portion distribution region to an edge of the first plating layer, that is, the amount of extension of first plating was changed by varying the electroless plating process time for forming the first plating layer, as shown in the column of "E1" in Table 4.

Next, a second plating layer constituted by an electrolytic Ni plating film that did not substantially contain P was formed on the first plating layer through the steps similar to those in Experimental Example 1. Here, the distance from the edge of the first plating layer to an edge of the second plating layer, that is, the amount of extension of second plating was changed by varying the electrolytic plating process time for forming the second plating layer, as shown in the column of "E2" in Table 4. Note that the sum of the amount of extension of first plating E1 and the amount of extension of second plating E2 was controlled to be about 20 μm. The total thickness of the first plating layer and the second plating layer, that is, the thickness of an outer electrode was in the range of about 5 μm to about 15 μm, for example.

Samples of monolithic ceramic capacitors were obtained as described above. For 1,000 samples, the occurrence or non-occurrence of separation of an outer electrode, that is, a partial detachment of an outer electrode due to the separation of a plating layer was examined by observing the appearance of each surface of the respective monolithic ceramic capacitors on which an edge of an outer electrode was formed. The results are shown in the column of the "occurrence rate of separation" of Table 4.

TABLE 4

| Sample No. | E1 | E2 | E1/(E1 + E2) × 100 | Occurrence rate of separation |
|---|---|---|---|---|
| 31 | 0 | 20 | 0 | 0/1000 |
| 32 | 1 | 19 | 5 | 0/1000 |
| 33 | 4 | 16 | 20 | 0/1000 |
| *34 | 7 | 13 | 35 | 3/1000 |
| *35 | 9 | 11 | 45 | 6/1000 |
| *36 | 12 | 8 | 60 | 12/1000 |

In Table 4, sample numbers marked with * are Comparative Examples that are out of the range of preferred embodiments of the present invention.

Referring to Table 4, it was discovered and confirmed that separation of an outer electrode did not occur in Sample Nos. 31 to 33, in which the numerical value of "E1/(E1+E2)×100" was about 20 or less, that is, the value represented by (amount of extension of first plating)/{(amount of extension of first plating)+(amount of extension of second plating)} was about 20% or less.

EXPERIMENTAL EXAMPLE 5

In order to confirm that various preferred embodiments of the present invention are suitable for the case where the P content of a Ni—P plating film constituting the first plating layer 20 is about 9% by weight or more and thus the Ni—P plating film becomes amorphous and is easily cracked, the P content was changed in Sample No. 2 (refer to Table 1) of Experimental Example 1 based on the first preferred embodiment and the occurrence or non-occurrence of separation of an outer electrode was examined in this case. The P content was controlled by changing the conditions for the electroless Ni—P plating bath. The method for examining the occurrence or non-occurrence of separation of an outer electrode and the method for measuring E1 and E2 are the same as those used in Experimental Example 1.

When the P content was about 9% by weight, E1 was about 3 μm, E2 was about 27 μm, and the value of E1/(E1+E2) was about 10%, for example. The occurrence rate of separation of an outer electrode was 0/1000. When the P content was about 13% by weight, E1 was about 4 μm, E2 was about 26 μm, and the value of E1/(E1+E2) was about 13%, for example. The occurrence rate of separation of an outer electrode was 0/1000. Thus, it was discovered and confirmed that even in the case where the P content of the Ni—P plating film constituting the first plating layer 20 was in the range of about 9% by weight or more and about 13% by weight or less, for example, separation of an outer electrode could be prevented by forming a phosphorus-free nickel plating film constituting the second plating layer 21 so as to satisfy the relationship E1/(E1+E2) 20%.

Other Preferred Embodiments

In the monolithic ceramic capacitors described above, the ceramic layers are preferably composed of a dielectric ceramic. However, the monolithic ceramic electronic component according to a preferred embodiment of the present invention is not limited to a monolithic ceramic capacitor. For example, the monolithic ceramic electronic component may be a component that is included in an inductor, a thermistor, or a piezoelectric component. Accordingly, the ceramic layers may be composed of a magnetic ceramic, a semiconductor ceramic, a piezoelectric ceramic, or the like in accordance with the function of the monolithic ceramic electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A monolithic ceramic electronic component comprising:
   a component body including a plurality of stacked ceramic layers and a plurality of electrode layers arranged along the ceramic layers, the electrode layers each including an exposed portion exposed at a particular surface; and
   an outer electrode disposed on the particular surface of the component body so as to be electrically connected to the exposed portions of the electrode layers; wherein
   the exposed portions of the electrode layers define an exposed portion distribution region on the particular surface;
   the outer electrode includes:
      a first plating layer that is an electrolessly plated layer disposed directly on the particular surface so as to cover the exposed portion distribution region; and
      a second plating layer that is an electrolytically plated layer that covers the first plating layer; and
   a following relationship is satisfied:

(amount of extension of first plating)/{(amount of extension of first plating)+(amount of extension of second plating)}≤20%, where the amount of extension of first plating represents a distance from an edge of the exposed portion distribution region to an edge of the first plating layer, and the amount of extension of second plating represents a distance from the edge of the first plating layer to an edge of the second plating layer.

2. The monolithic ceramic electronic component according to claim 1, wherein the electrode layers include an inner electrode arranged along an interface between the ceramic layers, and a surface electrode arranged along the ceramic layers and on an outer surface of the component body.

3. The monolithic ceramic electronic component according to claim 1, wherein
the first plating layer includes a Ni—P plating layer; and
a phosphorus content of the first plating layer is about 9% by weight to about 13% by weight.

4. The monolithic ceramic electronic component according to claim 1, wherein the second plating layer includes a plurality of plating films.

5. The monolithic ceramic electronic component according to claim 1, wherein
the first plating layer includes a Ni—P plating layer; and
a phosphorus content of the first plating layer is about 2% by weight to about 18% by weight.

6. The monolithic ceramic electronic component according to claim 1, wherein the amount of extension of the first plating is less than a thickness of the first plating layer.

7. The monolithic ceramic electronic component according to claim 1, wherein the amount of extension of the second plating is greater than a thickness of the second plating layer.

8. The monolithic ceramic electronic component according to claim 1, wherein the first plating layer includes a Ni—P plating layer that is amorphous.

9. The monolithic ceramic electronic component according to claim 1, further comprising auxiliary electrodes disposed at interfaces between the ceramic layers and auxiliary electrodes disposed on outer surfaces of the component body.

10. The monolithic ceramic electronic component according to claim 9, wherein the component body includes a plurality of first inner electrodes and a plurality of second inner electrodes alternately arranged in a stacking direction, and the plurality of auxiliary electrodes are arranged on both end portions of the component body in the stacking direction.

11. The monolithic ceramic electronic component according to claim 10, wherein the auxiliary electrodes are further arranged on a first main surface and a second main surface of the component body.

12. The monolithic ceramic electronic component according to claim 9, wherein four of the auxiliary electrodes are provided.

13. The monolithic ceramic electronic component according to claim 9, wherein eight of the auxiliary electrodes are provided.

14. The monolithic ceramic electronic component according to claim 1, wherein the monolithic ceramic electronic component is one of a two-terminal monolithic ceramic capacitor, a three-terminal monolithic ceramic capacitor, and an eight-terminal monolithic ceramic capacitor.

15. The monolithic ceramic electronic component according to claim 1, wherein the monolithic ceramic electronic component is one of a monolithic ceramic capacitor, an inductor, a thermistor, and a piezoelectric component.

16. The monolithic ceramic electronic component according to claim 1, wherein the ceramic layers are made of one of a dielectric ceramic, a magnetic ceramic, a semiconductor ceramic, and a piezoelectric ceramic.

* * * * *